United States Patent
Ueno et al.

(10) Patent No.: US 7,221,003 B2
(45) Date of Patent: May 22, 2007

(54) LIGHT EMITTING DEVICE

(75) Inventors: Kazuhiko Ueno, Tokyo (JP); Hiroshi Kotani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/276,834

(22) Filed: Mar. 16, 2006

(65) Prior Publication Data
US 2006/0208268 A1    Sep. 21, 2006

(30) Foreign Application Priority Data
Mar. 18, 2005    (JP)    ............................. 2005-079499

(51) Int. Cl.
*H01L 33/00*    (2006.01)
(52) U.S. Cl. .................... 257/98; 257/E33.06
(58) Field of Classification Search ................. 257/79, 257/98; 438/29
See application file for complete search history.

(56) References Cited

U.S. PATENT DOCUMENTS

| | | | |
|---|---|---|---|
| 5,962,971 A * | 10/1999 | Chen | ........................... 313/512 |
| 6,066,861 A | 5/2000 | Hohn et al. | |
| 6,245,259 B1 | 6/2001 | Hohn et al. | |
| 6,277,301 B1 | 8/2001 | Hohn et al. | |
| 6,482,664 B1 | 11/2002 | Lee et al. | |
| 6,576,930 B2 | 6/2003 | Reeh et al. | |
| 6,592,780 B2 | 7/2003 | Hohn et al. | |
| 6,613,247 B1 | 9/2003 | Hohn et al. | |
| 6,669,866 B1 | 12/2003 | Kummer et al. | |
| 6,680,569 B2 * | 1/2004 | Mueller-Mach et al. | .... 313/502 |
| 6,774,401 B2 | 8/2004 | Nakada et al. | |
| 6,809,342 B2 | 10/2004 | Harada | |
| 6,812,500 B2 | 11/2004 | Reeh et al. | |
| 6,858,869 B2 * | 2/2005 | Fujiwara | ....................... 257/79 |
| 2002/0093287 A1 * | 7/2002 | Chen | .......................... 313/512 |
| 2003/0122482 A1 * | 7/2003 | Yamanaka et al. | .......... 313/512 |
| 2004/0183085 A1 * | 9/2004 | Okazaki | ....................... 257/98 |
| 2005/0162069 A1 * | 7/2005 | Ota et al. | ..................... 313/501 |
| 2006/0099449 A1 * | 5/2006 | Amano et al. | .............. 428/690 |
| 2006/0208262 A1 * | 9/2006 | Sakuma et al. | ................ 257/79 |

FOREIGN PATENT DOCUMENTS

| | | |
|---|---|---|
| JP | 10190065 | 7/1998 |
| JP | 2001127346 | 5/2001 |
| JP | 2001196639 | 7/2001 |
| JP | 2001210872 | 8/2001 |
| JP | 2001345483 | 12/2001 |
| JP | 2004056075 | 2/2004 |

\* cited by examiner

*Primary Examiner*—Evan Pert
(74) *Attorney, Agent, or Firm*—Cermak & Kenealy, LLP

(57) ABSTRACT

A light-emitting device can include a blue LED chip that is covered in a sealing resin composed of a filling resin mixed with a wavelength conversion material, such as a yellow fluorescent material. Light from the blue LED chip is mixed with a light from the yellow fluorescent material to obtain white light emission having a mixed color. The sealing resin has a light emission surface, which can be symmetrical about the normal line passing through the center of the blue LED chip. An optical multi-layered film including layered high- and low-refractive index films can be provided on the light emission surface.

23 Claims, 3 Drawing Sheets

| Layer | Material | Refractive Index | Center Wavelength(nm) | Optical Film Thickness(nm) |
|---|---|---|---|---|
| 1 | $TiO_2$ | 2.40 | 402 | 50.3 |
| 2 | $SiO_2$ | 1.47 | 402 | 100.5 |
| 3 | $TiO_2$ | 2.40 | 402 | 100.5 |
| 4 | $SiO_2$ | 1.47 | 402 | 100.5 |
| 5 | $TiO_2$ | 2.40 | 402 | 100.5 |
| 6 | $SiO_2$ | 1.47 | 402 | 100.5 |
| 7 | $TiO_2$ | 2.40 | 402 | 100.5 |
| 8 | $SiO_2$ | 1.47 | 402 | 100.5 |
| 9 | $TiO_2$ | 2.40 | 402 | 100.5 |
| 10 | $SiO_2$ | 1.47 | 402 | 100.5 |
| 11 | $TiO_2$ | 2.40 | 402 | 75.4 |
| 12 | $SiO_2$ | 1.47 | 402 | 201.0 |

LIGHT EMITTING DEVICE

This application claims the priority benefit under 35 U.S.C. §119 of Japanese Patent Application No. 2005-079499 filed on Mar. 18, 2005, which is hereby incorporated in its entirety by reference.

BACKGROUND OF THE INVENTION

1. Field of the Invention

The invention relates to an LED lamp, and more particularly to a light-emitting device including a blue LED chip and a wavelength conversion material in combination. The light-emitting device is configured such that light emitted from the LED chip excites the fluorescent material. The light from the LED chip is mixed with light from the fluorescent material to obtain white light or a middle color light.

2. Description of Related Art

FIG. 5 shows a conventional art structure employed to obtain a pseudo-white LED lamp 90 with a blue LED chip 91 and a yellow fluorescent material 92 in combination. An element substrate 93 formed of a printed circuit board has two-polarity circuits 93a with positive and negative polarities formed thereon by appropriate means, such as etching. The LED chip 91 is die-bonded to the one polarity.

The LED chip 91 is wired through a gold wire 94 to the other polarity to supply power to the LED chip 91. The LED chip 91 is molded in a transparent sealing resin 95 such as epoxy to form a case 96 to protect both the LED chip 91 from humidity and the gold wire 94 from breaking due to mechanical stresses.

For formation of the white LED lamp 90 in particular, an appropriate amount of the fluorescent material 92 is mixed in the transparent resin 95 because the light emitted from the LED chip 91 is blue. In this case, the fluorescent material 92 causes yellow fluorescence when excited by the light emitted from the LED chip 91. As a result, the light discharged externally from the case 96 can be seen as white light after mixture of blue and yellow light which have a complementary relation therebetween (see U.S. Pat. No. 6,482,664, which is hereby incorporated in its entirety by reference).

In the white LED lamp 90 having the above-described conventional art structure, as shown in FIG. 5, different directions from which the LED lamp 90 is viewed results in differences in distance over which the light emitted from the LED chip 91 travels within the case 96 to the viewer. Therefore, depending on the viewing direction, blue light may collide with the fluorescent material 92 a different number of times.

As a result, the light seen at an angle, which makes a longer transmission distance in the sealing resin 95, is strongly tinged with yellow, and the light seen at an angle in which a shorter distance is traveled, is strongly tinged with blue. Thus, the color may feel as if it changes depending on the viewing direction, and variations in color may be felt depending on the shapes even when viewed in a single direction.

SUMMARY OF THE INVENTION

To prevent or suppress occurrences of variations in color, a light-emitting device can include a visible LED chip; a resin provided to seal the visible LED chip, the resin containing a fluorescent material that can be excited by light from the visible LED chip; and an optical multi-layered film provided to reflect the light from the visible LED chip at a certain ratio, and transmit light with longer wavelengths than that of the light from the visible LED chip and reflect light with shorter wavelengths than that of the light from the visible LED chip. The optical multi-layered film can be arranged on a light emission surface of the resin.

The optical multi-layered film can have a certain reflectivity against the visible light emitted from the LED chip. In addition, it can have the property of transmitting light with longer wavelengths than that of the light emitted from the visible LED chip and reflecting light with shorter wavelengths than that of the light emitted from the visible LED chip. This reflection property shifts light toward the shorter wavelength side as the angle of incident of light to the optical multi-layered film increases.

As a result, when the light derived from the LED chip is stronger in intensity than the light derived from the fluorescent material in a mixed color reaching the optical multi-layered film at a normal angle, only the light derived from the LED chip is reflected at a certain ratio. When the light derived from the fluorescent material is stronger than the light derived from the LED chip in the mixed color light that reaches the optical multi-layered film at a larger angle of incidence, both light emissions are transmitted therethrough to cancel the differences in emission colors due to the viewing directions.

BRIEF DESCRIPTION OF THE DRAWINGS

These and other features and advantages will become clear from the following description of exemplary embodiments and with reference to the accompanying drawings, wherein.

DETAILED DESCRIPTION OF EMBODIMENTS OF THE INVENTION

Figure 1:
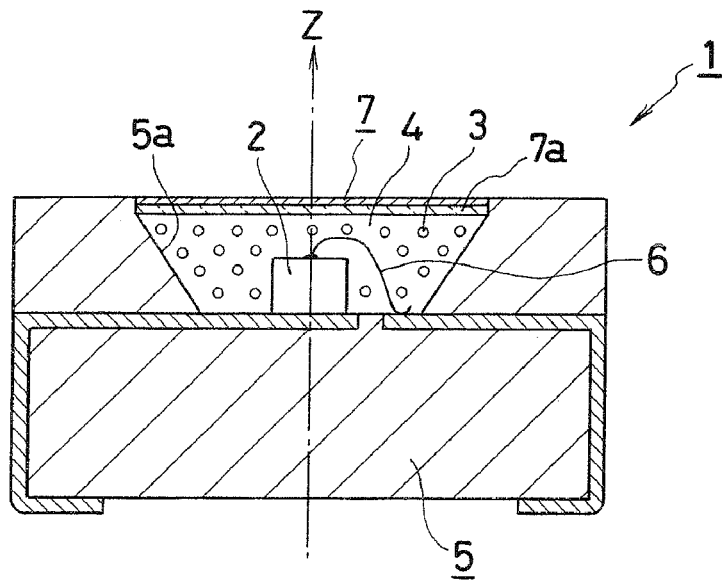
FIG. 1 is a cross sectional view showing an embodiment associated with a light-emitting device made in accordance with principles of the invention.

The invention will next be described based on embodiments illustrated in the drawings. The reference numeral 1 in FIG. 1 denotes a light-emitting device that utilizes a blue LED chip 2 as a light source. A transparent epoxy resin can be filled (molded) around the blue LED chip 2 for dampproofing to form a sealing resin 4. A wavelength conversion material, such as a yellow fluorescent material 3, can be mixed in the resin 4 to obtain white light emission.

The following description is simplified for ease of understanding. In this embodiment for example, an approximately conical recess 5a is formed in a housing, which can be configured as an element substrate 5. The blue LED chip 2 can be die-mounted on the bottom of the recess 5a and wired through a gold (or other) wire 6. Thereafter, the transparent epoxy resin can be filled up to almost the upper surface of the element substrate 5 to form the sealing resin 4 shaped as described herein. However, it should be noted that sealing resin 4 is not limited to this shape.

Figure 2:
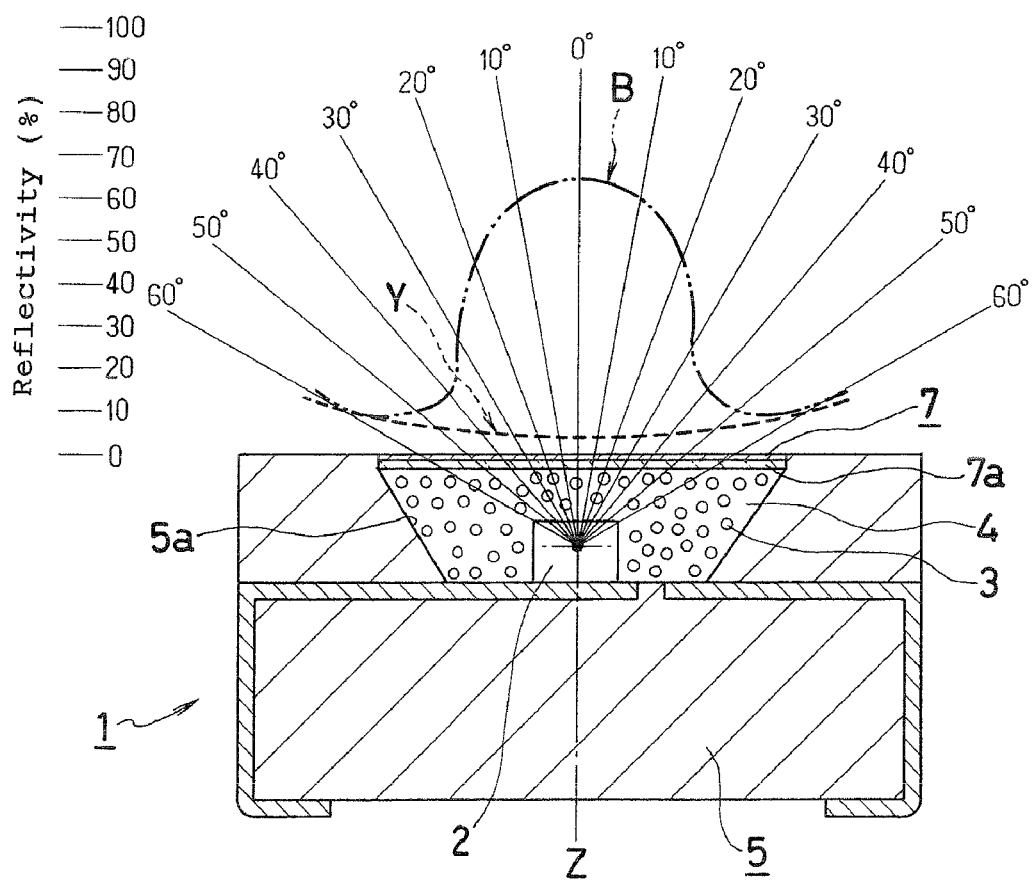
FIG. 2 is an enlarged illustrative partial view showing the light-emitting device along with a graph comparing viewing angle versus reflectivity for the light-emitting device of FIG. 1.

As described above, the yellow fluorescent material 3 can be previously mixed uniformly in the transparent epoxy resin that forms the sealing resin 4. FIG. 2 shows the sealing resin 4 formed in the recess 5*a* in detail. The sealing resin 4 thus configured causes differences in distance of traveling light when the light is emitted in various directions from the blue LED chip 2, transmitted through portions of the sealing resin 4, and externally discharged.

On average, the light emitted from the blue LED chip 2 at a larger angle to the optical axis Z has many opportunities to collide with the yellow fluorescent material 3 and becomes white near yellow. In contrast, the light emitted from the blue LED chip 2 at an angle close to the optical axis has fewer opportunities to collide with the fluorescent material and becomes white near blue. Thus, different viewing directions can give different light emission colors to the viewer.

Figures 3, 4:
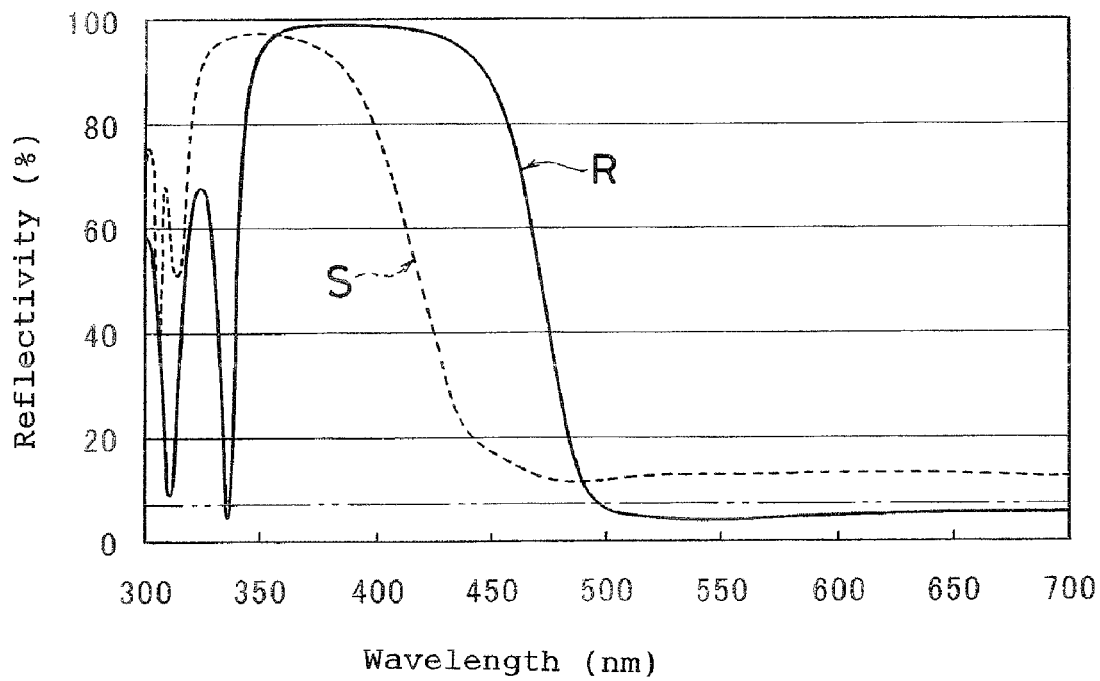
FIG. 3 is a table showing characteristics of an embodiment of an optical multi-layered film made in accordance with principles of the invention.
FIG. 4 shows a graph illustrative of differences in wavelength property between light transmitted through an optical multi-layered film made in accordance with principles of the invention at various angles.
Figure 5:
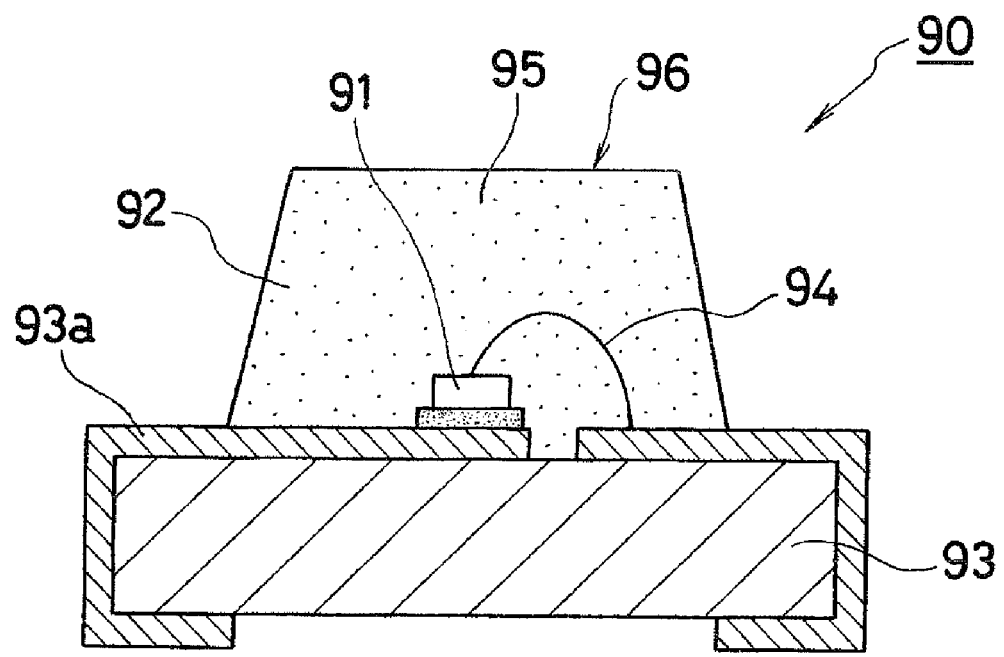
FIG. 5 is a cross sectional view showing a conventional art example.

This phenomenon can be avoided or suppressed by providing an optical multi-layered film 7 on at least a portion of the upper surface of the sealing resin 4. In the optical multi-layered film 7, a thin film of high refractive index material such as $TiO_2$ (e.g., with a refractive index=2.40), and a thin film of low refractive index material such as $SiO_2$ (e.g., with a refractive index=1.47) are layered, possibly alternately. The optical multi-layered film 7 can be arranged to cover the surface of the sealing resin 4, through which the lights are externally discharged, with the first layer located on the sealing resin 4. A structure of 12-layered thin films is depicted in FIG. 3.

Actually, it is difficult to form an extremely thin film with a thickness of about 100 nm precisely over the surface of the sealing resin 4. Moreover, it can be difficult to retain flatness of the film because of the mixture of the yellow fluorescent material 3 in the sealing resin 4. Accordingly, the optical multi-layered film 7 can be previously formed on a flatness-ensuring transparent substrate 7*a* of glass, for example, as shown in FIG. 1. It is then disposed on a certain position such as an upper location above the recess 5*a* of the element substrate 5.

Thereafter, means such as transfer molding may be applied to fill the recess 5*a* with the resin, which contains the additional yellow fluorescent material 3 for forming the sealing resin 4, for integration with the sealing resin 4 and the element substrate 5. In this way, appropriate means may be applied for attachment. In FIGS. 1 and 2, the optical multi-layered film 7 is illustrated to have a thickness for illustrating the presence thereof, even though it is actually equal to approximately 100 nm×12 layers.

If the optical multi-layered film 7 is not provided, the light emission surface of the sealing resin 4 can be seen as follows. Namely, the color varies concentrically about the optical axis Z, which extends through the center of the LED chip 2 and perpendicular to the light emission surface, in turn from white strongly tinged with blue to white strongly tinged with yellow. Therefore, application of means for increasing the blue light transmissivity depending on the distance from the optical axis Z on the light emission surface can prevent variations in color from occurring in the surface of the sealing resin 4 through which the light is externally discharged.

The optical multi-layered film 7 can be arranged and configured as the means for increasing the blue light transmissivity depending on the distance from the optical axis Z on the light emission surface. Namely, thin films of high-refractive index material and low-refractive index material can be layered to form a long-wavelength pass filter. This filter has cut-off wavelengths, which shift to the shorter wavelength side as the angle of incidence of transmitting light tilts from the normal to the filter. Thus, the transmitting wavelength shifts to the shorter wavelength side. This characteristic is combined with the characteristic of the sealing resin.

Specifically, the optical multi-layered film 7 is designed to have the center wavelength at violet near blue. In addition, part of the film thickness is controlled such that the reflectivity has a tilt at blue (longer wavelength side) as shown in FIG. 4 on a curve denoted with the reference symbol R. As a result, the more the light emitted from the blue LED chip tilts, the more the reflection property of the optical multi-layered film 7 shifts to the shorter wavelength side as shown in FIG. 4 on a curve (dotted line) denoted with the reference symbol S. Accordingly, the amount of blue light transmission increases and prevents the phenomenon in which light is strongly tinged with yellow as the light is viewed near the outer circumference of the sealing resin 4, as described above.

Referring again to FIG. 2, the optical multi-layered film 7 covering the light emission side of the sealing resin 4 can be configured to act as described below. The light from the blue LED chip collides with the yellow fluorescent material 3 at a lower probability in the front (0°) direction. In this direction, as shown with a curve B in FIG. 2, about 65% blue light is reflected toward the sealing resin 4 to prevent the light from being strongly tinged with blue when seen from the front, but transmits through the optical multi-layered film 7 obliquely. Namely, as the probability of collision with the yellow fluorescent material 3 increases, the reflectivity decreases to bring blue and yellow into balance. A curve is denoted with the reference symbol Y in FIG. 2 to show the reflectivity of the optical multi-layered film 7 against yellow light.

The operational principle is described above. In practical implementations, however, the amount of the yellow fluorescent material 3 mixed in the sealing resin 4 may change the distance of transference from the state in which light is strongly tinged with blue to the state strongly tinged with yellow. In addition, a different thickness of the sealing resin 4 covering the blue LED chip 2 may cause a difference in condition such that, for example, even the same distance from the optical axis Z results in a different angle of transmission through the optical multi-layered film 7. Therefore, these conditions should be taken into account to determine the above-described center wavelength of the optical multi-layered film 7, the additional amount of the yellow fluorescent material 3, and the thickness of the sealing resin 4.

The light-emitting device 1 is formed, as described above, such that it can be seen to be white from any direction, including the front direction and slanting directions. Accordingly, the light does not appear to be as strongly tinged with yellow when seen from the slanting directions as in the conventional art example. Thus, the viewer feels no sense of incongruity, and the quality of the light-emitting device 1 can be improved.

In a light emitting structure that includes the optical multi-layered film 7 which substantially or totally covers the sealing resin 4, blue light, which is excessive at the center (and not at a location in the film 7 that is close in distance to the blue LED chip), is reflected from the optical multi-layered film 7 into the sealing resin 4. The blue light then impinges the yellow fluorescent material 3 again and is converted into yellow light.

Therefore, the amount of the yellow fluorescent material 3 mixed in the sealing resin 4 may be less than that of the conventional art example. This is effective to prevent the completed light-emitting device 1 from becoming fragile, splitting and/or cracking easily when a foreign matter (such as, for example, fluorescent material) is excessively mixed in the resin that forms the sealing resin 4.

As the amount of the fluorescent material mixed in the sealing resin 4 can be reduced, the adhesion of the sealing resin 4 to the recess 5*a* in the element substrate 5 can be improved such that peeling at the interface between the sealing resin 4 and the recess 5*a* is reduced. In addition, air-tightness can be improved in the structure, and an improved lifetime can be expected.

At the same time, because a mixture of a reduced/small amount of the fluorescent material is sufficient, the viscosity of the resin on injection to form the sealing resin 4 can be lowered. This is effective to prevent occurrences of voids on injection and occurrences of breaks in the gold wire 6 on injection. This is also found effective secondarily to improve the conforming item rate.

The applicable range is not limited to a white LED including both a blue LED and the yellow fluorescent material in combination, as described in the above-referenced embodiment. Principles of the invention can be similarly applicable to other types of lamps, including any fluorescent LEDs, which include a visible LED or UV LED which excite a fluorescent material to emit white or middle color light. In addition, principles of the invention can be used in LEDs that incorporate other wavelength converting materials, or LEDs that generally require correction for wavelength variation dependent on viewing angle.

In addition, although the embodiments described above are directed to surface mount type LEDs, the principles of the invention can also be applied to other types of LEDs. Furthermore, while the housing in the above embodiment is described as an integral one piece structure, it can also be formed in separate and multiple parts that are adhered or attached to each other during manufacture. While there has been described what are at present considered to be exemplary embodiments of the invention, it will be understood that various modifications may be made thereto, and it is intended that the appended claims cover all such modifications as fall within the true spirit and scope of the invention.

What is claimed is:

1. A light-emitting device, comprising:
    an LED chip capable of emitting light;
    a resin located adjacent the LED chip and containing a wavelength conversion material that can be excited by light from the LED chip; and
    an optical multi-layered film located adjacent the resin and configured to transmit light that has a longer wavelength than the wavelength of the light emitted from the LED chip, and reflect light that has a shorter wavelength than the wavelength of the light emitted from the LED chip.

2. The light-emitting device according to claim 1, further comprising:
    a housing having a recess in which the LED chip is located, the recess having an opening and a bottom, wherein the LED chip is die-bonded on the bottom of the housing recess, the resin is injected into the recess, and the multi-layered film is arranged adjacent the opening of the recess.

3. The light-emitting device according to claim 2, further comprising:
    a transparent substrate located adjacent the resin, wherein the optical multi-layered film is formed on the transparent substrate and includes a layer of $SiO_2$ and a layer of any one of the group consisting of $TiO_2$, $Nb_2O_5$ and $Ta_2O$.

4. The light-emitting device according to claim 1, further comprising:
    a transparent substrate located adjacent the resin, wherein the optical multi-layered film is a layered film formed on the transparent substrate and includes a layer of $SiO_2$ and a layer of any one of the group consisting of $TiO_2$, $Nb_2O_5$ and $Ta_2O$.

5. The light-emitting device according to claim 1, wherein the LED chip is a visible LED chip.

6. The light-emitting device according to claim 1, wherein the optical multi-layered film is configured to reflect light from the LED chip at a predefined ratio.

7. The light-emitting device according to claim 1, wherein the resin includes a light emission surface, and the optical multi-layered film is located on the light emission surface of the resin.

8. The light-emitting device according to claim 1, wherein the optical multi-layered film includes a high refractive layer having a first refractive index and a low refractive layer having a second refractive index, and the first refractive index is higher than the second refractive index.

9. The light-emitting device according to claim 8, wherein the first refractive index is about 2.40 and the second refractive index is about 1.47.

10. The light-emitting device according to claim 1, wherein the optical multi-layered film includes a plurality of high refractive layers each having a high refractive index and a plurality of low refractive layers each having a low refractive index relative to the high refractive indexes.

11. The light-emitting device according to claim 10, wherein the plurality of high refractive layers are arranged alternatingly with the plurality of low refractive layers on top of the resin.

12. The light-emitting device according to claim 1, further comprising:
    a transparent substrate located between the resin and the optical multi-layered film.

13. A light-emitting device, comprising:
    an LED chip capable of emitting light along an optical axis of the light emitting device;
    a resin having a light emission surface through which the optical axis intersects, the resin being located adjacent the LED chip and containing a wavelength conversion material that can be excited by light from the LED chip; and
    means located adjacent the resin for increasing blue light transmissivity from the light-emitting device depending on distance from the optical axis along the light emission surface.

14. The light-emitting device according to claim 13, further comprising:
    a housing having a recess in which the LED chip is located, the recess having an opening and a bottom, wherein the LED chip is die-bonded on the bottom of the housing recess, the resin is injected into the recess, and the multi-layered film is arranged adjacent the opening of the recess.

15. The light-emitting device according to claim 13, further comprising:
    a transparent substrate located adjacent the resin, wherein the means for increasing blue light transmissivity is located on the transparent substrate.

16. The light-emitting device according to claim 13, wherein the means for increasing blue light transmissivity includes an optical multi-layered film including a layer of $SiO_2$ and a layer of any one of the group consisting of $TiO_2$, $Nb_2O_5$ and $Ta_2O$.

17. The light-emitting device according to claim 13, wherein the means for increasing blue light transmissivity includes an optical multi-layered film including a high refractive layer having a first refractive index and a low refractive layer having a second refractive index, the first refractive index being higher than the second refractive index.

18. A light-emitting device, comprising:
  an LED chip capable of emitting light;
  a resin having a light emission surface, the resin being located adjacent the LED chip and containing a wavelength conversion material that can be excited by light from the LED chip; and
  at least one low refractive index layer located adjacent the emission surface of the resin and having a low refractive index, and at least one high refractive index layer located adjacent the emission surface of the resin and having a high refractive index as compared to the low refractive index wherein the low refractive index layer and the high refractive index layer are configured to transmit light that has a longer wavelength than the wavelength of the light emitted from the LED chip, and to reflect light that has a shorter wavelength than the wavelength of the light emitted from the LED chip.

19. The light-emitting device according to claim 18, further comprising:
  a housing having a recess in which the LED chip is located, the recess having an opening and a bottom, wherein the LED chip is die-bonded on the bottom of the housing recess, the resin is injected into the recess, and the low refractive index layer and high refractive index layer are arranged at the opening of the recess.

20. The light-emitting device according to claim 18, further comprising:
  a transparent substrate located adjacent the resin, wherein the low refractive index layer and high refractive index layer are located on the transparent substrate.

21. A light-emitting device, comprising:
  an LED chip capable of emitting light;
  a resin having a light emission surface, the resin being located adjacent the LED chip and containing a wavelength conversion material that can be excited by light from the LED chip; and
  at least one low refractive index layer located adjacent the emission surface of the resin and having a low refractive index, and at least one high refractive index layer located adjacent the emission surface of the resin and having a high refractive index as compared to the low refractive index wherein the low refractive index layer and the high refractive index layer act to increase blue light transmissivity from the light-emitting device depending on distance from the optical axis along the light emission surface.

22. The light-emitting device according to claim 21, further comprising:
  a housing having a recess in which the LED chip is located, the recess having an opening and a bottom, wherein the LED chip is die-bonded on the bottom of the housing recess, the resin is injected into the recess, and the low refractive index layer and high refractive index layer are arranged at the opening of the recess.

23. The light-emitting device according to claim 21, further comprising:
  a transparent substrate located adjacent the resin, wherein the low refractive index layer and high refractive index layer are located on the transparent substrate.

* * * * *